US008907543B2

(12) United States Patent
Martin et al.

(10) Patent No.: US 8,907,543 B2
(45) Date of Patent: Dec. 9, 2014

(54) SURFACE ACOUSTIC WAVE COMPONENT

(75) Inventors: Guenter Martin, Dresden (DE); Bert Wall, Potsdam (DE)

(73) Assignee: Vectron International GmbH, Teltow (DE)

( * ) Notice: Subject to any disclaimer, the term of this patent is extended or adjusted under 35 U.S.C. 154(b) by 434 days.

(21) Appl. No.: 13/239,745

(22) Filed: Sep. 22, 2011

(65) Prior Publication Data

US 2012/0080979 A1  Apr. 5, 2012

(30) Foreign Application Priority Data

Oct. 5, 2010  (DE) .......................... 10 2010 041 973

(51) Int. Cl.
*H01L 41/047* (2006.01)
*H03H 9/145* (2006.01)

(52) U.S. Cl.
CPC ....... *H03H 9/14502* (2013.01); *H03H 9/14538* (2013.01)
USPC .................................. 310/313 D; 310/313 B

(58) Field of Classification Search
CPC ..................... H03H 9/14505; H03H 9/14547
USPC ........................................... 310/313 B, 313 D
See application file for complete search history.

(56) References Cited

U.S. PATENT DOCUMENTS

| 5,773,911 | A * | 6/1998 | Tanaka et al. ............. 310/313 B |
| 5,892,418 | A * | 4/1999 | Onishi et al. ................... 333/193 |
| 6,853,269 | B2 * | 2/2005 | Nakamura et al. ............. 333/193 |
| 6,960,866 | B2 * | 11/2005 | Kando ....................... 310/313 C |
| 7,023,300 | B2 * | 4/2006 | Jian et al. ...................... 333/195 |
| 7,285,894 | B1 * | 10/2007 | da Cunha .................. 310/313 A |
| 2002/0149295 | A1 * | 10/2002 | Onishi et al. .............. 310/313 R |
| 2004/0150292 | A1 * | 8/2004 | Kidoh ........................ 310/313 R |
| 2004/0164644 | A1 * | 8/2004 | Nishiyama et al. ........ 310/313 A |
| 2009/0161490 | A1 * | 6/2009 | Wall et al. ..................... 367/140 |

FOREIGN PATENT DOCUMENTS

DE   10 2010 028 007   11/2010

OTHER PUBLICATIONS

P.V. Wright, "The natural single-phase unidirectional transducer: A new low-loss SAW transducer," Proc. 1985 IEEE Ultrasonics Symposium, pp. 58-63.
T. Thorvaldsson and B.P. Abbott, "Low loss SAW filters utilizing the natural single phase unidirectional transducer (NSPUDT)," Proc. 1990 IEEE Ultrasonics Symposium, pp. 43-48.

(Continued)

*Primary Examiner* — Thomas Dougherty
*Assistant Examiner* — Bryan Gordon
(74) *Attorney, Agent, or Firm* — Collard & Roe, P.C.

(57) ABSTRACT

A surface wave component contains at least two interdigital transducers having natural unidirectionality, disposed on a piezoelectric crystal substrate, which form a transducer pair consisting of transmission transducer and reception transducer. The transducers consist of an interdigital electrode structure having prongs and bus bars, and have opposite forward directions. At least two of the prongs form a transducer cell that has at least one excitation center for exciting an electrical potential wave and at least one reflection center for reflection of electrical potential waves, The transducer cells consist of two prongs having the same width, having a distance between the prong centers equal to half the length of a transducer period, whereby the electrode structures of the two transducers consist of the same material, but have different layer thicknesses.

6 Claims, 1 Drawing Sheet

(56) References Cited

OTHER PUBLICATIONS

D.P. Morgan, S. Zhgoon, A. Shvetsov, E. Semenova, and V. Semenov, "One-port SAW resonators using Natural SPUDT substrates," Proc. 2005 IEEE Ultrasonics Symposium, pp. 446-449.

M. Takeuchi, "Natural single-phase unidirectional transducer on a $LiNbO_3$ substrate for SAW sensor applications," Proc. 2008 IEEE Frequency Control Symposium, pp. 152-155.

C.S. Lam and D. Gunes, "A low-loss SAW filter using two-finger per wavelength electrodes on the NSPUDT orientation of quartz," Proc. 1993 IEEE Ultrasonics Symposium, pp. 185-188.

K. Yamanouchi, M. Takeuchi, H. Odagawa and M. Tanaka, "Low-loss saw filters using thickness difference type IDT on the NSPUDT orientation substrate," Proc. 1995 IEEE International Frequency Control Symposium, pp. 537-541.

* cited by examiner

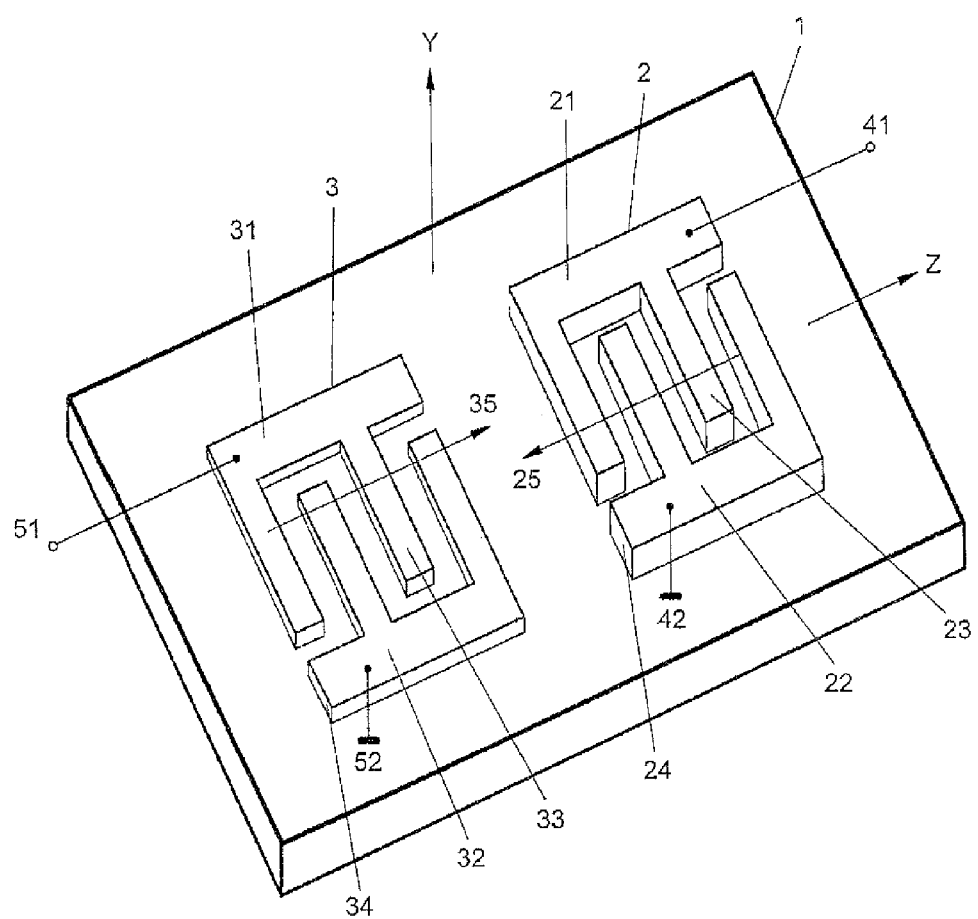

SURFACE ACOUSTIC WAVE COMPONENT

CROSS REFERENCE TO RELATED APPLICATIONS

Applicants claim priority under 35 U.S.C. §119 of German Application No. 10 2010 041 973.7 filed Oct. 5, 2010, the disclosure of which is incorporated by reference.

BACKGROUND OF THE INVENTION

1. Field of the Invention

The present invention relates to the field of electrical technology/electronics and concerns a surface acoustic wave component. The component according to the invention is useful in filters, delay lines, resonators, and oscillators, but also sensors and identification components, to the extent that their method of functioning is based on surface acoustic waves.

2. The Prior Art

Surface acoustic wave components are known, in which at least two transducers having natural unidirectionality are disposed on a piezoelectric crystal substrate. In this connection, the transducers have an interdigital electrode structure having prongs and bus bars. At least two of the prongs form a transducer cell that has at least one excitation center for exciting an electrical potential wave and at least one reflection center for reflection of electrical potential waves.

On piezoelectric crystal substrates, surface acoustic waves contain not only mechanical particle displacements but also an electrical potential that spreads at the same velocity and wavelength as the mechanical particle displacements. This electrical potential, as an integral part of the surface acoustic wave, is referred to as an electrical potential wave.

A prerequisite for the existence of unidirectional properties of interdigital transducer cells is that the distance between the excitation center and the reflection center in one and the same cell amounts to precisely or approximately ±⅛ or ±⅜ of the wavelength. This wavelength corresponds to the quotient of the phase velocity of the surface wave divided by the frequency at which the transducer emits the maximal surface wave amplitude. Aside from wave excitation, reflection of waves is therefore a necessary condition for the existence of unidirectional properties. Excitation center and reflection center mean the excitation center and reflection center of the electrical potential of the surface acoustic wave. Natural unidirectionality is present if, despite the symmetrical structure of the transducer cell being considered, a greater wave amplitude is emitted in one direction—referred to as the forward direction—than in the opposite direction (backward direction). A symmetrical transducer consists, for example, of cells that consist of prongs having the same width, which have different polarity and whose prong centers have a distance of half a wavelength. If the distance of the excitation center from a reflection center of a cell does not deviate significantly from ±⅛ or ±⅜ of the wavelength, then the natural unidirectionality is referred to as being complete. Otherwise, it is referred to as being incomplete.

In the case of absence of a natural unidirectionality or natural unidirectional properties, the cells contain prongs having different widths, generally having different prong distances—in the case of more than two prongs per cell. Such a cell has an asymmetrical structure, considered in the propagation direction. If a transducer having a symmetrical structure possesses unidirectional properties, one refers to this property as natural unidirectionality.

In a special embodiment (P. V. Wright, "The natural single-phase unidirectional transducer: A new low-loss SAW transducer," Proc. 1985 IEEE Ultrasonics Symposium, pages 58-63, hereinafter also referred to as [1]), the unidirectional properties of transducers on a quartz substrate, which are composed of cells having two fingers having a width of ¼ of the wavelength (i.e. having fingers of the same width) and a gap between them having a width of ¼ of the wavelength, are generated by rotating the propagation direction of the surface acoustic waves away from the crystalline X axis. During propagation of the surface acoustic waves in the direction of the X axis, there are no unidirectional properties for the transducer type used. More detailed information concerning a propagation direction of surface acoustic waves having natural unidirectionality can be found in another special embodiment (T. Thorvaldsson and B. P. Abbott, "Low loss SAW filters utilizing the natural single phase unidirectional transducer (NSPUDT)," Proc. 1990 IEEE Ultrasonics Symposium, pages 43-48, referred to as [2]). The crystal section of quartz and the propagation direction are determined by the Euler angles (0°, 124°, 25°.) This combination is characterized by complete natural unidirectionality. Another example for natural unidirectionality is langasite ($La_3Ga_5SiO_{14}$) having the Euler angles (0°, 138.5°, 26.6°) (D. P. Morgan, S. Zhgoon, A. Shvetsov, E. Semenova, and V. Semenov, "One-port SAW resonators using Natural SPUDT substrates," Proc. IEEE Ultrasonics Symposium, pages 446-449, referred to as [3]). In this case, the natural unidirectionality is incomplete.

A transducer having natural unidirectionality was also already proposed, in which the prongs are oriented perpendicular to a direction R. The direction R is directed parallel to a monad or triad axis of rotation of the substrate crystal, and the derivation $dv/d\theta=0$ holds true for the direction R, wherein $v$ is the phase velocity of the surface wave and $\theta$ is an angle deviation of the perpendicular to the prong direction from this direction R, The directions perpendicular to a mirror plane of the substrate crystal are excepted, and for the arrangement of the interdigital electrode structure, the crystal substrate surfaces parallel to a mirror plane of the substrate crystal or perpendicular to a dyad, tetrad, or hexad axis of rotation of the substrate crystal are excepted (DE 10 2010 028 007.0).

In another known special embodiment, transducers having natural unidirectionality with opposite forward directions are implemented on a $LiNbO_3$ substrate having the Euler angles (0°, 38°, 20°) in that the electrode structure of one of the transducers consists of copper, and the electrode structure of the second transducer, in each instance, consists of aluminum (M. Takeuchi, "Natural single-phase unidirectional transducer on a $LiNbO_3$ substrate for SAW sensor applications," Proc. 2008 IEEE Frequency Control Symposium, pages 152-155).

The transducers described in this document, having natural unidirectionality, have the disadvantage that the technological effort in the production of components that contain these transducers is too great, as a result of the fact that the electrode structure of one of the transducers consists of copper and the electrode structure of the second transducer consists of aluminum, that copper and aluminum are not suitable for higher temperatures, and that copper is not suitable for those types of package that are carried out in an oxygen-rich atmosphere.

SUMMARY OF THE INVENTION

It is therefore an object of the present invention to provide a surface acoustic wave component, in which interdigital transducers having natural unidirectionality are disposed on a piezoelectric crystal substrate in such a manner that they can be produced with reduced technological effort, that they possess suitability for high temperatures, and that they are also suitable for types of package that are carried out in an oxygen-rich atmosphere.

This object is accomplished by a surface acoustic wave component that contains at least two interdigital transducers having natural unidirectionality disposed on a piezoelectric crystal substrate. The transducers form a transducer pair composed of a transmission transducer and a reception transducer. Each of these transducers consist of an interdigital electrode structure having prongs and bus bars, and have opposite forward directions. At least two of the prongs form a transducer cell that has at least one excitation center for excitation of an electrical potential wave and at least one reflection center for reflection of electrical potential waves.

According to the present invention, the excitation center is understood to be the line dependent on the geometry of the interdigital electrode structure, the piezoelectric crystal substrate, and the electrical potentials of the unidirectional transducer, parallel to the prong edges, at which the electrical potential wave, which is a component of the surface waves produced, is excited.

According to the present invention, the reflection center is understood to be the line dependent on the geometry of the interdigital electrode structure, the piezoelectric crystal substrate, and the electrical potentials of the unidirectional transducer, parallel to the prong edges, at which the electrical potential wave excited by the excitation center, which is a component of the surface waves produced, is reflected.

In the component according to the invention, the transducer cells consist of two prongs having the same width, having a distance between the prong centers equal to half the length of a transducer period. The electrode structures of the two transducers consist of the same material, but the layer thickness of the electrode structures differs, in a comparison of the two transducers with one another.

The different layer thicknesses provided for electrode structures of the transducers and the uniform electrode structure material achieve the surprising result that the transducers of the transducer pair have opposite forward directions, and thus the prerequisite for low losses of the component exists.

Another characteristic according to the invention consists in that the piezoelectric crystal substrate is a Y cut of $LiNbO_3$. The direction perpendicular to the prong edges is directed parallel to the crystallographic Z axis of the $LiNbO_3$.

This direction is the propagation direction of the surface waves excited by the corresponding transducer, and has the further advantage of being a pure mode direction. This is understood to mean that the velocity depends parabolically on changes in the propagation direction, whereby the apex of the parabola coincides with the direction of the Z axis of $LiNbO_3$. As a result, defects in the orientation of the electrode structures on the substrate have only a slight effect.

According to the invention, the material for the electrode structures of the transducers is platinum, a platinum-based alloy, gold, and/or a gold-based alloy. In this connection, the electrode structures can be structured from these materials in a single layer or multiple layers.

In connection with the present invention, platinum-based alloy is understood to be an alloy having a platinum mass proportion $\omega > 0.5$ (>50 mass percent), and a gold-based alloy is understood to be an alloy having a gold mass proportion $\omega > 0.5$ (>50 mass percent). The alloy additives to platinum in the platinum-based alloy can preferably be gold, silver, iridium, rhodium, ruthenium, and aluminum. The alloy additives to gold in the gold-based alloy can preferably be platinum, silver, iridium, rhodium, ruthenium, and aluminum.

For the case that the electrode structures consist of platinum or a platinum-based alloy, according to the invention, the thickness of the electrode layer of one of the transducers of a transducer pair is supposed to lie in the range of 0.012 to 0.029 of the length of the period of this transducer. In contrast, the thickness of the electrode layer of the second transducer of a transducer pair is supposed to lie in the range of 0.045 to 0.053 of the length of the period of this transducer.

For the case that the electrode structures consist of gold or a gold-based alloy, according to the invention, the thickness of the electrode layer of one of the transducers of a transducer pair is supposed to lie in the range of 0.010 to 0.015 or of 0.024 to 0.032 of the period length of this transducer. In contrast, the thickness of the electrode layer of the second transducer of a transducer pair is supposed to lie in the range of 0.045 to 0.053 of the period length of this transducer.

It is advantageous that maximization of the width of the prongs and gaps between the prongs, at a given cell length, is possible when a transducer cell consists of two prongs having the same width and having the distance between the prong centers equal to half the length of a transducer period.

An advantageous embodiment of the invention consists in that the component contains only two transducers having opposite forward directions of the natural unidirectionality.

According to another embodiment of the invention, at least one of the transducers can function as a reflector, whereby an electrical alternating voltage is neither applied to nor tapped from such a transducer. In this connection, it is practical if an ohmic resistance or an ohmic resistance and a reactance, preferably an inductance, can be switched in parallel with each reflector.

The component according to the invention demonstrates multiple advantages as compared with the state of the art.

A significant advantage consists in that these components can be produced with reduced technological effort, because a uniform material can be used for the deposition of the electrode structures of all the transducers. The material used for the electrode structures, according to the invention, has the advantage, with its relatively high melting point, that the components can be used at higher temperatures and are suitable for greater stresses. Furthermore, the material used for the electrode structures, according to the invention, because of its good chemical stability, allows a simpler technology in connection with package, because this can be carried out even in an oxygen-rich atmosphere.

BRIEF DESCRIPTION OF THE DRAWINGS

Other objects and features of the present invention will become apparent from the following detailed description considered in connection with the accompanying drawing. It is to be understood, however, that the drawing is designed as an illustration only and not as a definition of the limits of the invention.

The drawing shows a top view of one embodiment of the component according to the invention.

DETAILED DESCRIPTION OF THE PREFERRED EMBODIMENT

The drawing shows two interdigital transducers 2 and 3 forming a transducer pair disposed on a substrate 1 that is a Y cut of $LiNbO_3$. Substrate 1 and transducer pair 2,3 together form a component for surface acoustic waves. Transducer 2 consists of bus bars 21 and 22 as well as prongs 23, and transducer 3 consists of bus bars 31 and 32 as well as prongs 33. The number of prongs 23, 33 of transducer 2, 3 can be very much greater than shown in the drawing. The edges of prongs 23 and 33 are directed perpendicular to the crystallographic Z axis of $LiNbO_3$.

With the counting direction from left to right in the drawing, the 1st and 2nd prong as well as the 3rd and 4th prong of prongs 23 of transducer 2, in pairs, form a transducer cell, as do the 1st and 2nd as well as the 3rd and 4th prong of the prongs 33 of transducer 3. The length of a period of transducer 2 is the sum of the widths of the 1st and 2nd prong of prongs 23 and of the widths of the gaps between the 1st and the 2nd prong and between the 2nd and 3rd prong of the prongs 23. The length of a period of transducer 3 is the sum of the widths of the 1st and 2nd prong of the prongs 33 and of the widths of the gaps between the 1st and the 2nd prong and between the 2nd and 3rd prong of the prongs 33.

The material that forms the electrode layers of the transducers 2, 3 is platinum. The thicknesses of electrode layers 24, 34 of transducers 2, 3 differ from one another. The thickness 24 of the electrode layer of transducer 2 amounts to 0.027 times the length of a period of the transducer 2, while the thickness 34 of the electrode layer of the transducer 3 amounts to 0.048 times the length of a period of the transducer 3. As a result of the different layer thicknesses, forward directions 25, 35 of transducers 2, 3 are directed toward the other transducer. As a result, the wave amplitudes that are emitted in the directions opposite to forward directions 25, 35 are small in comparison with the amplitudes that are emitted in forward directions 25, 35. This results in a reduction in the losses of the component in comparison with those cases in which forward directions 25, 35 of transducers 2; 3 are not directed toward the other transducer.

Connector 41 and mass connection 42 form the input of the component, and connector 51 and the mass connection 52 form its output. However, the component can also be operated vice versa.

Accordingly, while only a few embodiments of the present invention have been shown and described, it is obvious that many changes and modifications may be made thereunto without departing from the spirit and scope of the invention.

What is claimed is:

1. A surface acoustic wave component comprising:
   a piezoelectric crystal substrate; and
   at least two interdigital transducers having natural unidirectionality disposed on the piezoelectric crystal substrate, said transducers forming a transducer pair consisting of a transmission transducer and a reception transducer;
   wherein said transducers have an interdigital electrode structure having prongs and bus bars and have opposite forward directions, with at least two of the prongs forming a transducer cell that has at least one excitation center for exciting an electrical potential wave and at least one reflection center for reflection of electrical potential waves,
   wherein each of the transducer cells consist of two prongs having the same width, wherein a distance between centers of the two prongs is equal to half a length of a transducer period, and wherein electrode structures of the two transducers consist of the same material, but have different layer thicknesses from each other and
   wherein the piezoelectric crystal substrate is a Y cut of $LiNbO_3$, and wherein a direction perpendicular to edges of the prong is directed parallel to a crystallographic Z axis of the $LiNbO_3$.

2. The component according to claim 1, wherein the electrode structure of transducers is comprised of a single layer or multi-layer structure made of at least one of platinum, a platinum-based alloy, gold and a gold-based alloy.

3. The component according to claim 2, wherein the electrode structure consists of platinum or a platinum-based alloy, and a thickness of an electrode layer of one of the transducers of the transducer pair lies in the range of 0.012 to 0.029 times a period length of said one transducer, and a thickness of the electrode layer of the other transducer of the electrode pair lies in the range of 0.045 to 0.053 times a period length of said other transducer.

4. The component according to claim 2, wherein the electrode structure consists of gold or a gold-based alloy and a thickness of the electrode layer of one of the transducers of the transducer pair lies in the range of 0.010 to 0.015 or of 0.024 to 0.032 times a period length of said one transducer, and the thickness of the electrode layer of the other transducer of the transducer pair lies in the range of 0.045 to 0.053 times a period length of said other transducer.

5. The component according to claim 1, wherein the component contains only two transducers having opposite forward directions of a natural unidirectionality.

6. The component according to claim 1, wherein at least one of the transducers functions as a reflector and wherein an electrical alternating voltage is neither applied to nor tapped from said one transducer.

* * * * *